US009614158B2

United States Patent
Sirringhaus et al.

(10) Patent No.: US 9,614,158 B2
(45) Date of Patent: Apr. 4, 2017

(54) BLENDED POLYMER FETS

(71) Applicants: CAMBRIDGE ENTERPRISE LIMITED, Cambridge (GB); TECHNISCHE UNIVERSITEIT EINDHOVEN, Eindhoven (NL); EIDGENOESSISCHE TECHNISCHE HOCHSCHULE ZUERICH, Zurich (CH)

(72) Inventors: Henning Sirringhaus, Cambridge (GB); Shalom Goffri, Cambridge, MA (US); Rene A. J. Janssen, Eindhoven (NL); Christopher Paul Radano, Broomall, PA (US); Paul Smith, Zurich (CH); Christian Muller, Zurich (CH); Pascal Wolfer, Zurich (CH); Natalie Stingelin-Stutzmann, London (GB)

(73) Assignees: CAMBRIDGE ENTERPRISE LIMITED, Cambridge (GB); TECHNISCHE UNIVERSITEIT EINDHOVEN, Eindhoven (NL); EIDGENOSSICHE TECHNISCHE HOCHSCHULE ZURICH, Zurich (CH)

( * ) Notice: Subject to any disclaimer, the term of this patent is extended or adjusted under 35 U.S.C. 154(b) by 157 days.

(21) Appl. No.: 13/952,945

(22) Filed: Jul. 29, 2013

(65) Prior Publication Data
US 2014/0027745 A1 Jan. 30, 2014

Related U.S. Application Data

(62) Division of application No. 12/306,432, filed as application No. PCT/GB2007/002460 on Jun. 29, 2007, now Pat. No. 8,518,738.

(30) Foreign Application Priority Data

Jun. 29, 2006 (GB) .................................. 0612929.0

(51) Int. Cl.
H01L 29/08 (2006.01)
H01L 51/00 (2006.01)
H01L 51/05 (2006.01)

(52) U.S. Cl.
CPC ...... H01L 51/0034 (2013.01); H01L 51/0012 (2013.01); H01L 51/0566 (2013.01);
(Continued)

(58) Field of Classification Search
CPC ............ H01L 51/0512; H01L 51/0012; H01L 51/0034; H01L 51/0566; H01L 51/0529
(Continued)

(56) References Cited

U.S. PATENT DOCUMENTS 6,284,832 B1 9/2001 Foulger et al.
6,329,062 B1 12/2001 Gaynor
(Continued)

FOREIGN PATENT DOCUMENTS

JP 200641495 A 2/2006
JP 2007110105 A 4/2007
(Continued)

OTHER PUBLICATIONS

Christopher P. Radano et al., Crystalline-Crystalline Block Copolymers of Regioregular Poly(3-hexylthiophene) and Polyethylene by Ring-Opening Methathesis Polymerization, (2005), pp. 12502-12503 vol. 127.
(Continued)

Primary Examiner — Trung Q Dang
(74) Attorney, Agent, or Firm — Sughrue Mion, PLLC

(57) ABSTRACT

A method for forming a semiconductor body, the method comprising: forming a mixture of an organic semiconduct-
(Continued)

ing material and a binder material; causing the semiconducting material to at least partially solidify; and causing the binder material to crystallize in such a way as to cause the semiconducting material to at least partially segregate from the binder material.

16 Claims, 16 Drawing Sheets

(52) U.S. Cl.
 CPC ...... *H01L 51/0036* (2013.01); *H01L 51/0541* (2013.01); *H01L 51/0545* (2013.01); *Y02E 10/549* (2013.01)

(58) Field of Classification Search
 USPC ...................................... 438/99, 780; 257/40
 See application file for complete search history.

(56) References Cited

U.S. PATENT DOCUMENTS

| | | | |
|---|---|---|---|
| 2004/0061104 A1* | 4/2004 | Bao | H01L 51/0545 257/40 |
| 2005/0026344 A1* | 2/2005 | Weng et al. | 438/197 |
| 2006/0014365 A1 | 1/2006 | Kugler et al. | |
| 2007/0215902 A1 | 9/2007 | Nakagawa | |
| 2008/0035915 A1* | 2/2008 | Russell | H01L 51/0004 257/40 |
| 2010/0019233 A1 | 1/2010 | Kawashima et al. | |
| 2011/0092015 A1 | 4/2011 | Clough et al. | |
| 2013/0240792 A1* | 9/2013 | Wigglesworth et al. | 252/500 |

FOREIGN PATENT DOCUMENTS

| | | |
|---|---|---|
| WO | 2005/024895 A2 | 3/2005 |
| WO | 2006019133 A1 | 2/2006 |
| WO | 2006/064183 A1 | 6/2006 |

OTHER PUBLICATIONS

N. Corcoran et al., Increased efficiency in vertically segregated thin-film conjugated polymer blends for light-emitting diodes, Jan. 13, 2003, pp. 299-301, vol. 82 No. 2; (XP002454646).

D.M. Russell et al., "Blends of semiconductor polymer and small molecular crystals for improved-performance thin-film transistors",2005, pp. 222109-1-222109-3, vol. 87 (XP002454647).

Japanese Office Action corresponding to Japanese Patent Application No. 2009-517414, dated Jun. 12, 2012.

* cited by examiner

BLENDED POLYMER FETS

CROSS-REFERENCE TO RELATED APPLICATIONS

This is a Divisional of application Ser. No. 12/306,432 filed Oct. 13, 2009, which is the National Stage Entry of PCT GB 07/002,460, filed on Jun. 29, 2007, which claims priority from British application GB 06 12929.0, filed Jun. 29, 2006, the content of these applications being incorporated herein by reference.

Conjugated polymer semiconductors can be processed from solution, which makes these materials compatible with a range of printing techniques and enables low-cost manufacturing of electronic devices on light-weight, flexible substrates. A particularly attractive feature of solution processing is the ease of forming new materials with designed properties that comprise a mixture of several polymer components. By carefully controlling the morphology of a polymer blend deposited from a suitable cosolvent through judicious choice of composition and processing conditions the mechanical, optical and electronic properties of the resulting film can often be improved compared to a single-component system (Morteani et al., Phys. Rev. Lett. 92, 247402 (2004)); Halls et al., Nature 376, 498 (1995)). In some cases the addition of a suitable binder polymer is even imperative, for example to meet the ink rheology requirements for specific printing steps (de Gans, Adv. Mat. 16, 203 (2004)). In the case of a polymer FET the use of binders is challenging because in a two-component active layer, charge transport tends to occur in one of the components preferentially, for example, hole charge carriers are located preferentially in the component with the lowest ionisation potential, and the presence of a second semiconducting or dielectric component tends to degrade device performance. This has been observed in several systems. In blends of poly(3-hexylthiophene) (P3HT) with polystyrene (PS) the mobility decreases by several orders of magnitude with decreasing percentage of P3HT (Babel, et al. Macromolecules 37, 9835 (2004)). In P3HT:PS diblock copolymers the conductivity is much reduced when the content of the P3HT block in the overall BCP is decreased (Liu, et al., Angewandte Chemie International Edition 41, 329 (2002)). The morphology of polymer blends is controlled by phase separation which occurs even for small unfavourable enthalpic interactions between the two polymers as a result of the small entropy of mixing. Under most conditions phase separation proceeds laterally in the plane of the film. Vertically stratified morphologies are less common (Arias et al., Macromolecules 34, 6005 (2001)), but are expected to be advantageous for FET applications, if the active component can be made to phase separate to the interface with the gate dielectric and create a continuous pathway for charge transport (Chua, et al., Advanced Materials 16, 1609 (2004)). It has recently been shown that a vertically stratified morphology is an intermediate morphology during spin coating, but breaks up into a laterally phase separated morphology driven by a thin film instability (Heriot et al., Nature 4, 782 (2005)). Phase separation also determines the morphology of block copolymers, but in this case it can only occur on the nanometer scale. Much of the work in the literature on polymer blends and block copolymers in the literature has been on amorphous-amorphous or crystalline-amorphous systems. Much less is known about systems in which the binder is a crystalline polymer. For conventional (non-electroactive) polymers crystalline-crystalline blends have been studied and the effect of adjusting the process temperature with respect to the melting points of the two component polymers (Ikehara, et al. Macromolecules 38, 5104 (2005)). The microstructure of conventional crystalline-crystalline blockcopolymer has also been investigated, and the influence of epitaxy or directional solvent crystallization (Park et al., Polymer 44, 6725 (2003)) has been studied.

In WO2005104625 a method is described for melt processing of an organic semiconductor. A dewetting agent in the form of a polymer is mixed into a solution of the organic semiconductor. The organic semiconductor is preferably a small molecule semiconductor, such as rubrene, which has a tendency to dewet from the substrate when heated above its melting point. This is prevented by the presence of the dewetting agent. The dewetting agent is preferably a polymer, such as polystyrene. A second substance might also be added to the formulation of the organic semiconductor to reduce the melting point and to prevent crystallization of the organic semiconductor in the as-deposited film. It is present in a composition of 1% to 50%, most preferably 5-15%. If the organic semiconductor is diluted further its charge transport properties are degraded. No mention is made of any requirements on the binder polymer to avoid this degradation.

BACKGROUND OF THE INVENTION

In US 2004/0038459 a method is described for mixing an organic semiconductor with a polymer binder. The requirement for the polymer binder is that it has a low dielectric constant. However, as can be seen from the Table included in US 2004/0038459, the binder is present in the formulation at a weight ratio of typically less than 50%, and already in this range a significant reduction of field-effect mobility is observed compared to the pure semiconducting polymer. This document indicates that one criterion for selecting the binder is that its dielectric constant E needs to be sufficiently low to avoid lowering of the mobility as a result of increased dipolar disorder (for PS $\in=2.6$). However, no mention is made of any requirements on the binder polymer to avoid the degradation in the field-effect mobility that is observed when the semiconducting component is being diluted with the binder.

The present invention is concerned with avoiding the commonly observed degradation of electrical performance upon mixing a binder polymer into the organic semiconductor formulation. We show that the key step of achieving this is to use a crystalline binder polymer.

According to a first aspect of the present invention there is provided a method for forming a semiconductor body, the method comprising: forming a mixture of an organic semiconducting material and a binder material; causing the semiconducting material to at least partially solidify; and causing the binder material to crystallize in such a way as to cause the semiconducting material to at least partially segregate from the binder material.

Preferably the step of causing the semiconducting material to at least partially solidify is performed prior to the step of causing the binder to crystallize. The step of causing the semiconducting material to at least partially solidify comprises may cause the semiconducting material to crystallize. Suitably the step of causing the binder material to crystallize comprises decreasing the temperature of the mixture.

Preferably the organic semiconducting material is a semiconducting polymer. Preferably the binder material is a semi-crystalline polymer. The organic semiconducting polymer may form a block copolymer with the polymer binder. The binder material may be semiconducting.

Preferably the mixture comprises a solvent and the method further comprises the step of removing the solvent prior to the step of causing the binder material to crystallize. Preferably the step of removing the solvent occurs prior to the step of causing the semiconducting material to solidify.

The organic semiconductor may be poly-3-hexylthiophene (P3HT) or α-quaterthiophene (4T). The binder may be isotactic polystyrene (i-PS) or high-density polyethylene (HDPE).

According to a second aspect of the present invention there is provided a method for forming a semiconductor body, the method comprising: forming a mixture of an organic semiconducting material and a binder material; causing the semiconducting material to at least partially solidify; and causing the binder material to crystallize in such a way as to cause the semiconducting material to become concentrated at the interfaces of the binder material with adjacent media.

The interfaces of the binder material may include those interfaces between adjacent layers of binder material.

According to a third aspect of the present invention there is provided a method for forming a semiconductor body, the method comprising: forming a mixture of an organic semiconducting material and a binder material; and causing the binder material to coalesce in such a way as to cause the semiconducting material to segregate from the binder material.

Preferably the step of causing the semiconducting material to solidify occurs prior to the step of causing the binder material to coalesce. Preferably the step of causing the semiconducting material to solidify comprises causing the semiconducting material to crystallize.

Suitably the step of causing the binder material to coalesce comprises decreasing the temperature of the mixture. The segregated semiconducting material and binder material may form a stratified structure.

Preferably the mixture of the organic semiconducting material and binder material is deposited onto a substrate. Preferably the step of causing the binder material to coalesce comprises causing the binder material to crystallize.

According to a fourth aspect of the present invention there is provided an electronic device comprising a semiconducting body, the body comprising: an organic semiconducting material; a crystalline binder material.

Preferably the organic semiconducting material is predominantly concentrated at the interfaces of the semiconducting body with adjacent media. The semiconducting body may be phase-segregated.

The crystalline binder material may be a dielectric, semiconductor or conductor. The organic semiconducting material may be a semi-crystalline polymer. The crystalline binder material may be a semi-crystalline polymer.

Suitably the organic semiconducting material has a melting point above that of the crystalline binder material.

The crystalline binder material may exhibit a spherrulitic microstructure.

The concentration of the organic semiconducting material in the semiconducting body may be less than 10%, 20%, 30%, 40% or 50% by weight.

Preferably the semiconducting body defines a geometric plane and the organic semiconducting material has a lamellar structure, the lamellae being oriented so as to lie generally in that plane.

The device may be a transistor, diode or photovoltaic diode.

Preferably the organic semiconducting material concentrated at the interfaces of the semiconducting body with adjacent media constitutes a continuous path for charge transport through the organic semiconducting material from a source electrode of the transistor to a drain electrode of the transistor.

According to a fifth aspect of the present invention there is provided a semiconducting layer comprising a binder and an organic semiconducting material, the organic semiconducting material being concentrated in lamellar zones that are segregated from the binder and are orientated so as to lie generally in the plane of the layer.

According to a sixth aspect of the present invention there is provided a plastic substrate comprising an organic semiconductor material and a semi-crystalline polymer binder.

The concentration of the organic semiconducting material in the substrate may be less than 10%, 20%, 30%, 40% or 50% by weight. The organic semiconducting material may be a semiconducting polymer. Preferably the substrate is flexible.

According to an aspect of the invention we disclose an electronic device comprising a semiconducting layer, wherein said semiconducting layer contains an organic semiconductor, and a crystalline binder. By using a crystalline binder the concentration of the active polymer semiconductor can be reduced to values as low as 3-5% or below without any degradation in the field-effect mobility. In the context of the present invention the term binder refers simply to a component which is mixed together with the organic semiconductor layer. Its main function is to modify the mechanical, film-forming or processing properties of the material. As such it can be a dielectric material which does not contribute directly to the charge transport in the semiconducting layer. However, it is also possible to incorporate an additional electro-optical or semiconducting function into the binder (see, for example, discussion of FIG. 16). Preferrably, the binder is a crystalline polymer. In another embodiment of the present invention, the binder is a crystalline, solution-processable small molecule or oligomeric molecule.

Preferably the organic semiconductor and the crystalline binder are segregated in the semiconducting layer.

FIG. 15a shows a schematic diagram of an electronic switching device comprising a substrate 1, on which a gate electrode 2 is deposited and patterned. A gate dielectric layer 3 is then deposited, and source-drain electrodes 4 are then patterned. Then the semiconducting layer of the device is deposited from a solution or from the melt. The semiconducting layer comprises an organic semiconductor and a crystalline binder polymer. As a result of the crystalline nature of the binder the organic semiconducting layer is driven to segregate to the interface with the substrate 5 and to the surface 7 in a vertically stratified morphology. The layer of binder 6 in between might contain a small concentration of the organic semiconductor, for example because of the some miscibility of the organic semiconductor in a molten phase of the binder. However, most of the organic semiconducting material segregates to the surface and interface of the film where it forms a continuous pathway for charge transport along the gate dielectric/semiconductor interface leading to a high mobility even for a small concentration of organic semiconductor. In this way it is possible to avoid the commonly observed degradation of electrical performance upon mixing a binder into the organic semiconductor formulation.

Preferably, the degree of crystallinity of the binder is between 5% and 100%.

According to an aspect of the present invention we disclose a method for forming an electronic device comprising a semiconducting layer, wherein said method comprises depositing said semiconducting layer from a solution containing an organic semiconductor and a binder that is capable of crystallising. Preferably the deposition conditions are such that the binder and the semiconductor segregate in the semiconducting layer. Preferably the deposition conditions are such that the binder, or a substantial proportion of it, crystallises during and/or after deposition. Preferably, the deposition conditions are selected such that the organic semiconductor solidifies before the binder crystallizes. This preferably occurs upon removal of the solvent. The result is preferably that the semiconducting layer adopts a stratified morphology, which preferably comprises one or more sub-layers of the organic semiconductor and one or more layers of the binder. Those sub-layers may be vertically distinct: i.e. they may lie generally parallel to a substrate on which the layer may be deposited.

Without wanting to be bound by theory, the method is believed to be based on the strong enthalpic crystallization forces of the binder that expel the semiconducting component into a vertically stratified morphology to the surface and interface of the film during the crystallization of the binder.

The semiconductor and the binder may be distinct materials. Alternatively, they may be embodied as components of a single material, for example as blocks of a common molecule. The single material could comprise a polymer that includes one or more semiconducting blocks or components and one or more binder blocks or components.

According to an aspect of the present invention we disclose an electronic device comprising a semiconducting layer, wherein said semiconducting layer contains a diblock copolymer with an active semiconductor first block and a semiconducting or dielectric second block wherein the second block is a crystalline polymer.

FIG. 15a shows a schematic diagram of an electronic switching device comprising a substrate 1, on which a gate electrode 2 is deposited and patterned. A gate dielectric layer 3 is then deposited, and source-drain electrodes 4 are then patterned. Then the semiconducting layer of the device is deposited from a solution or from the melt. The semiconducting layer comprises a diblock copolymer with a semiconducting polymer block and a crystalline dielectric block. As a result of the crystalline nature of the dielectric block the semiconducting block is driven to segregate to the interface with the substrate 5 and to the surface 7 in a vertically stratified morphology. The layer 6 in between which is enriched in the dielectric block 6 might contain a small concentration of the polymer semiconductor, particularly when the film thickness is selected such that it is not possible for the semiconducting polymer to undergo microphase separation and reach the interface or surface (due to the covalent link with the dielectric which exists in this case. However, the semiconducting polymer that is able to segregate to the surface and interface of the film forms a continuous pathway for charge transport along the gate dielectric/semiconductor interface leading to a high mobility even for a small concentration of polymer semiconductor. In this way it is possible to avoid the commonly observed degradation of electrical performance for semiconducting diblock copolymers as the length of the dielectric block is increased with respect to that of the semiconducting block.

According to an aspect of the present invention we disclose a method for forming an electronic device comprising a semiconducting layer of a diblock copolymer with an active semiconductor first block and a crystalline semiconducting or dielectric second block, wherein said method comprises depositing said semiconducting layer from a solution containing the diblock copolymer. Preferably, the deposition conditions are selected such that upon removal of the solvent the first block solidifies before the second block crystallizes. Without wanting to be bound by theory the method is believed to be based on the strong enthalpic crystallization forces of the binder that expel the semiconducting component into a vertically stratified morphology to the surface and interface of the film during the crystallization of the binder.

According to an aspect of the present invention we disclose a method for forming a free-standing semiconducting film, fibre, tape, and other objects wherein said reestanding semiconducting film, fibre, tape, and other objects comprises an organic semiconductor and a crystalline binder.

The use of crystalline-crystalline polymer blends and blockcopolymers enables new processing pathways for controlling the microstructure of functional polymers, and greater flexibility for realizing high-performance semiconducting polymer films with reduced cost, and improved mechanical and electrical properties by removing the need to design all the application requirements into the active semiconducting polymer itself. The method opens up new approaches for realizing vertically stratified structures in semiconducting polymer blends that are of interest also for a variety of other device applications such as photovoltaic cells. By diluting the relatively expensive semiconducting material with a lower cost commodity polymer without loss of performance the technique also offers significant potential for cost reduction, as materials cost in many organic-based products are dominated by the semiconducting polymer. This enables the use of free-standing semiconducting polymer substrates, fibres, tapes, and other objects that make use of the excellent mechanical properties of binder polymers such as polyethylene.

According to an aspect of the present invention there is provided a method for forming a semiconductor body, the method comprising: forming a mixture of an organic semiconducting material and a binder material; and causing the binder material to coalesce in such a way as to cause the semiconducting material to segregate from the binder material. The binder material and the conditions prevailing during the step of causing the binder material to coalesce are preferably such as to cause the binder material to adopt a phase in which it is energetically favourable for the semiconductor material to fully or substantially segregate from the binder material. The step of causing the binder material to coalesce preferably comprises causing the binder material to crystallize. The method preferably comprises the step, prior to the step of causing the binder material to coalesce, of causing the semiconducting material to solidify. The mixture may also comprise a solvent. The semiconductor body could form a semiconductor component of a semiconductor device.

In each aspect of the invention the organic semiconductor could be made up of two or more organic semiconductor materials. These could segregate into a blended phase comprising two or more such materials, or they could segregate from each other as well as from the binder. The binder could be made up of two or more binder materials. These could segregate into a blended phase comprising two or more such materials, or they could segregate from each other as well as from the semiconductor material(s).

In each embodiment the concentration of the organic semiconductor, or such of the semiconducting polymer as is active, is preferably below 20%, more preferably below 10% and most preferably below 5% or 3%, by mass or volume of the semiconducting layer or film, or of any other form of semiconducting structure that is formed.

BRIEF DESCRIPTION OF THE DRAWINGS

The invention will now be described with reference to the following figures.

DESCRIPTION OF PREFERRED EMBODIMENTS

Example 1

Blends of P3HT with Isotactic and Atactic Polystyrene

As a first system we investigated blends of regioregular P3HT with polystyrene comparing directly crystalline isotactic (i-PS) with amorphous, atactic (a-PS) polystyrene.

Ternary blend solutions of P3HT and i-PS (0.1 wt % of P3HT, weight ratio of P3HT to i-PS of 1:9) were prepared in trichlorobenzene (TCB). The hot solution was deposited by drop-casting onto a substrate held at a temperature of 180° C. After the solvent had evaporated the substrate was cooled down slowly to a crystallization temperature $T_c$=120° C. where it was held to allow the i-Ps to crystallize before cooling the samples to room temperature (RT). P3HT and i-PS have similar melting points (around 240° C.), and both polymers are soluble in TCB in dilute solution at room temperature. Under the conditions used here the P3HT crystallizes first, because of the slow crystallization kinetics of the i-PS at the selected crystallization temperature $T_c$. The need for crystallizing the semiconducting polymer first will be discussed in more detail below. For a-PS we used identical process conditions, but in this case the PS remains amorphous.

Figure 3:
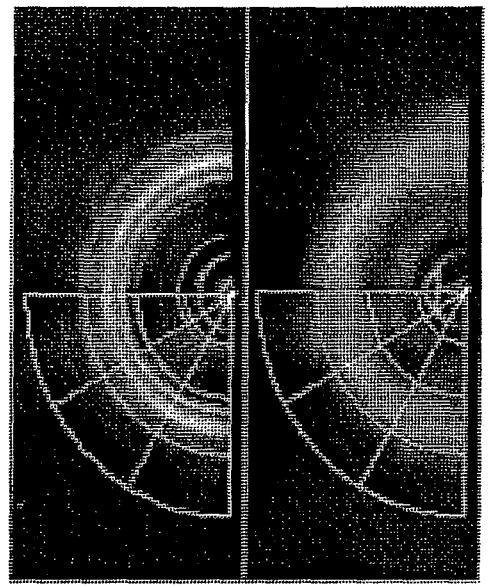
FIG. 3 shows wide angle X-ray scattering (WAXS) images of P3HT/I-PS blends (top) and P3HT/a-PS blends (bottom).

Grazing incidence wide angle X-ray scattering (WAXS) was used to determine the microstructure of the films. The data is presented as a function of the scattering vector Q=4

π sin θ/λ, where θ is the Bragg angle and λ is the X-ray wavelength. A huge difference in microstructure is observed between the two PS species; whereas a-PS is essentially amorphous, many sharp higher order reflections are observed for the highly crystalline i-PS (FIG. 3). The intensity distribution on the Debye-Scherrer rings appears to be essentially uniform, consistent with an isotropic distribution of the i-PS crystallite orientations. In the sample with a-PS the P3HT 100 diffraction is rather weak and broad, no higher order diffractions are observed. In i-PS, the characteristic 100 and 200 diffraction peaks are sharp and clearly resolved, indicating that the P3HT is in a significantly more crystalline state than in the a-PS samples. The P3HT 300 and 020 ("π-stack") peaks cannot be observed as they overlap with the i-PS peaks. The P3HT h00 peaks due to the lamellar stacking exhibit higher intensity out-of-plane, indicating that the conjugated lamellae are oriented in the plane of the film, which is the favourable orientation for charge transport (Sirringhaus et al., Nature 401, 685 (1999)).

Figure 1:
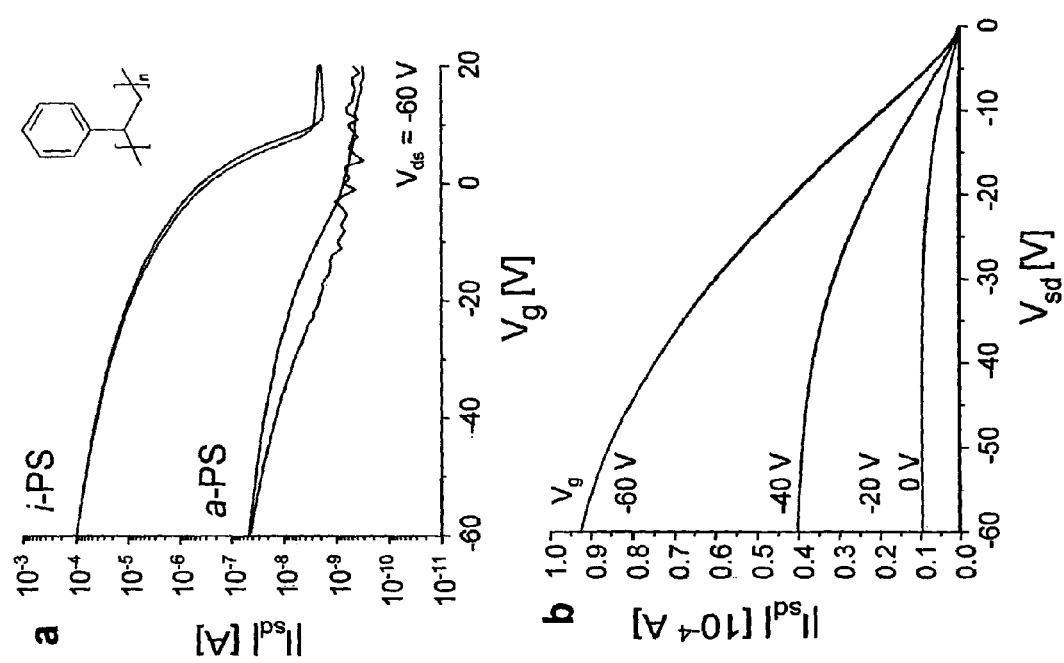
FIG. 1 shows (a) transfer characteristics measured at $V_{ds}=-60$ V for a 10 wt % poly-3-hexylthiophene (P3HT): isotactic polystyrene (i-PS) blend and 10% P3HT:atactic polystyrene (a-PS) blend processed under the same conditions; (b) Output characteristics of 10 wt % P3HT:i-PS blend.
Figure 2:
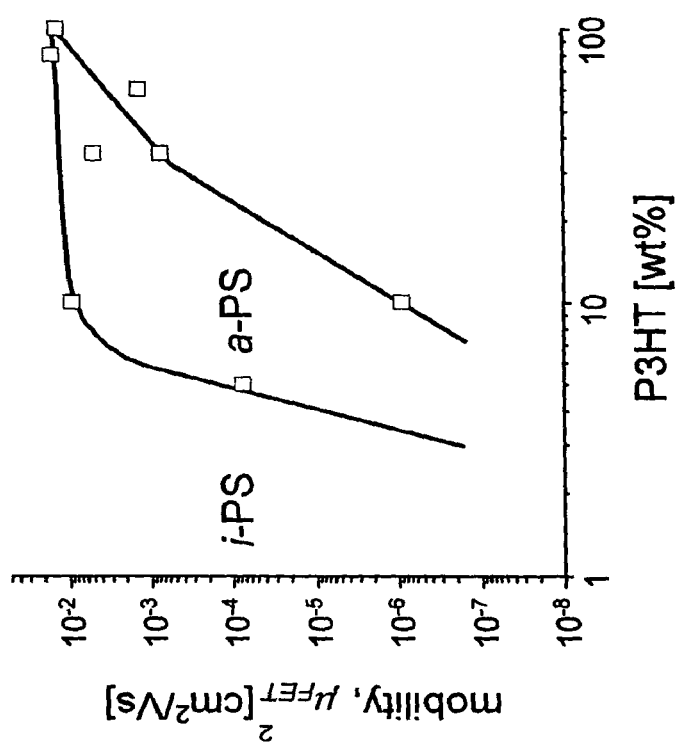
FIG. 2 shows mobility as a function of P3HT concentration in blends of P3HT:i-PS (i-PS $M_w$400,000), and P3HT: a-PS (a-PS $M_w$400,000).

The electrical transport in such blend films was studied in standard bottom-gate FET configurations by drop-casting the blend solution onto a heated hexamethyldisilazane (HMDS) treated Si—SiO$_2$ with pre-patterned Au source and drain electrodes (L=20 μm, W/L=500) under identical film processing conditions as described above. The mobility of the P3HT:a-PS (1:9) blend films was $5 \cdot 10^{-6}$ cm$^2$/Vsec in agreement with previously reported results. (FIG. 1). The mobility in the P3HT:a-PS system shows typical percolation behaviour as a function of the P3HT concentration consistent with previous results (Babel, et al. Macromolecules 37, 9835 (2004)) (FIG. 2). The mobility exhibits a monotonous decrease with decreasing P3HT concentration, already at a concentration of 30% the mobility is an order of magnitude lower than that of pure P3HT. The percolation threshold below which the mobility becomes zero appears to be below 10%. In contrast, the P3HT/i-PS exhibit much better performance and the mobility remains at a high value of $1 \cdot 10^{-2}$ cm$^2$/Vs very close to that of pure P3HT down to concentrations of 10%, and only drops rapidly when the P3HT concentration is lower than 5-10%. This is clear evidence that the use of a crystalline as opposed to an amorphous binder can have dramatic influence on the ability of the blend to maintain a continuous network for charge transport even for low concentrations of the semiconducting component.

Example 2

Blends of P3HT with Polyethylene

Figure 4:
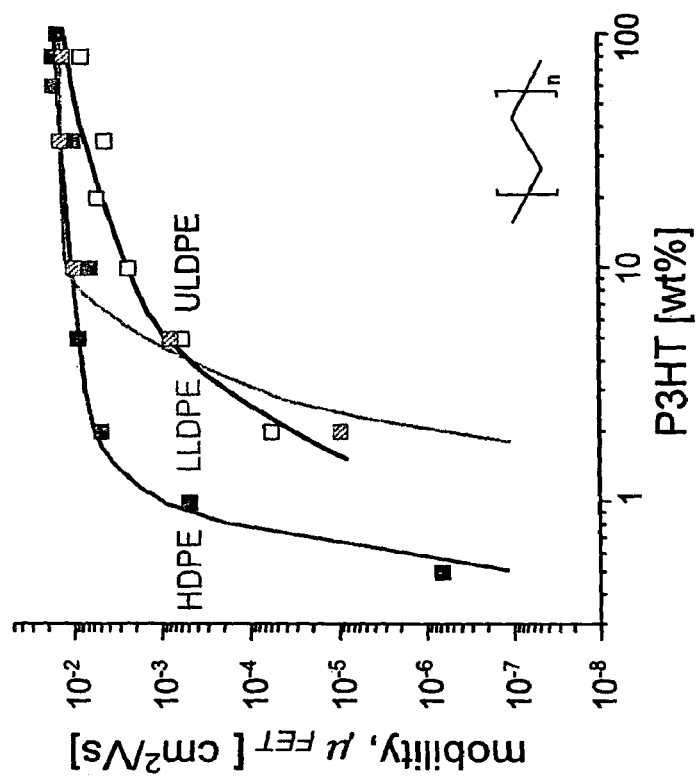
FIG. 4 shows the mobility as a function of P3HT concentration in blends of P3HT with high-density polyethylene (HDPE) ($M_n$ 51,000, $M_w$221,000), low-density PE (LDPE) ($M_n$ 20,000, $M_w$ 200,000), and ultra-low density PE (ULDPE)

To prove the generality of the observed phenomenon we also studied blends of P3HT and polyethylene (PE). PE is a cheap, commodity crystalline polymer (E=2.3) available in a wide range of molecular weights and degrees of crystallinity. The crystallinity can be controlled by the amount of side chains and branching. We have compared highly crystalline, high density PE (HDPE), semi-crystalline linear low density PE (LLDPE) and near amorphous ultra low density PE (ULDPE) of different molecular weights. We drop-cast a hot solution of P3HT-PE in either xylene or TCB onto a substrate held at a temperature of 140° C., wait for the solvent to evaporate and then cool down to RT. The substrate temperature is above the melting point of PE ($T_m$=115° C.) but below the melting point of P3HT. Under these conditions the P3HT crystallizes first during the evaporation of the solvent while being embedded in a matrix of molten PE. PE crystallizes later when the substrate temperature is ramped back down to room temperature. Remarkably, in P3HT-HDPE blends for P3HT concentrations as low as 3-5% we retain a high mobility of $1 \cdot 10^{-2}$ cm$^2$/Vs, which is identical to that of a pure P3HT reference sample of the same molecular weight processed under the same conditions (FIG. 4). By optimizing film deposition conditions it was possible to achieve mobilities of up to 0.06 cm$^2$/Vs in blends containing only 10% P3HT, which is close to the highest mobility values reported for P3HT (Sirringhaus et al., Nature 401, 685 (1999)). The mobility only drops rapidly when the P3HT content in the films is below 3%. In the P3HT:LLDPE case a similar behaviour is observed but the drop in mobility occurs already at higher P3HT concentrations of 10%. With near amorphous ULDPE the mobility decreases monotonously when the P3HT fraction in the film is reduced. The behaviour of the ULDPE blends approaches the classical percolation behaviour reported above for the a-PS blends.

Figure 6:
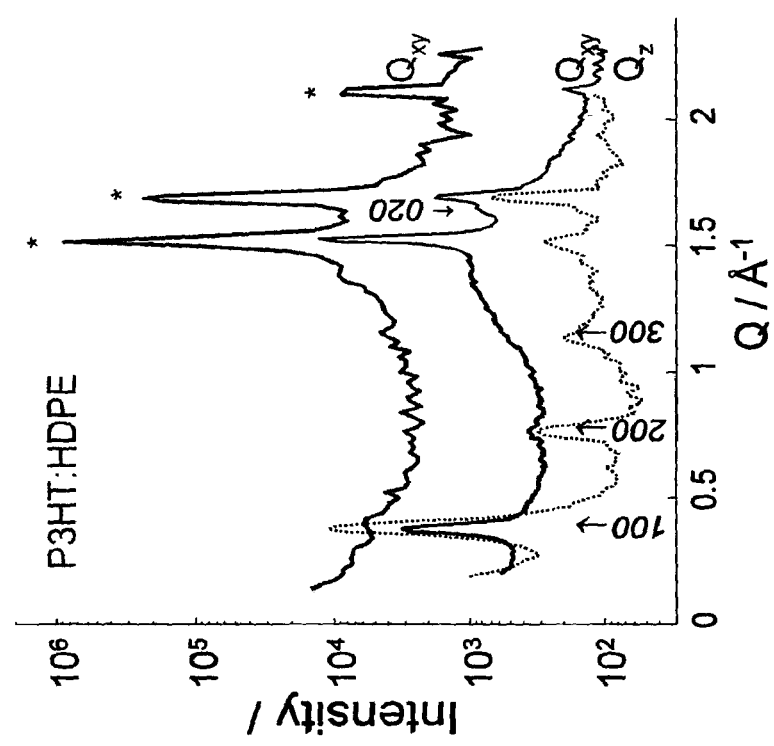
FIG. 6 shows grazing-incidence X-ray diffraction (GIXD) scans for P3HT-PE blends processed under conditions for which P3HT crystallizes first (dotted line—out-of-plane diffraction, solid line—in-plane diffraction) and in-plane diffraction for P3HT-PE blends processed under conditions for which PE crystallizes first. The main PE reflections, (110 at Q=1.52 Å$^{-1}$, 200 at Q=1.69 Å$^{-1}$ and the weaker 210 at Q=2.11 Å$^{-1}$) are indicated with asterisks.

To achieve such high performance in dilute blends and blockcopolymers the order in which the two components are crystallized has been found to be essential. If film processing conditions are chosen such that the PE crystallizes before the P3HT, for example, by drop-casting from a hot solution onto a substrate held at a temperature below the melting point of PE much lower performance was observed. In blends of blend of P3HT/HDPE (1:9) processed under such conditions where the P3HT needs to crystallize at a point in time when the surrounding PE has already solidified low mobilities of $8 \cdot 10^{-6}$ cm$^2$/Vs and on-off ratios of 100 were observed. GIXRD taken on high-mobility films grown under conditions where the P3HT crystallizes first shows that both the P3HT and the PE are crystalline (FIG. 6). The P3HT (h00) diffractions are more pronounced in the out-of-plane than in the in-plane scattering geometry which means that the P3HT lamellae have preferential in-plane orientation consistent with the high mobility. In contrast, in films grown with the same composition, but under conditions in which the PE is crystallized first, no evidence for crystalline diffractions from the P3HT were observed, while strong PE diffractions are present. This suggests that when the P3HT solidification occurs in an environment of solid PE the P3HT is not able to crystallize efficiently resulting in a low mobility.

Figure 5:
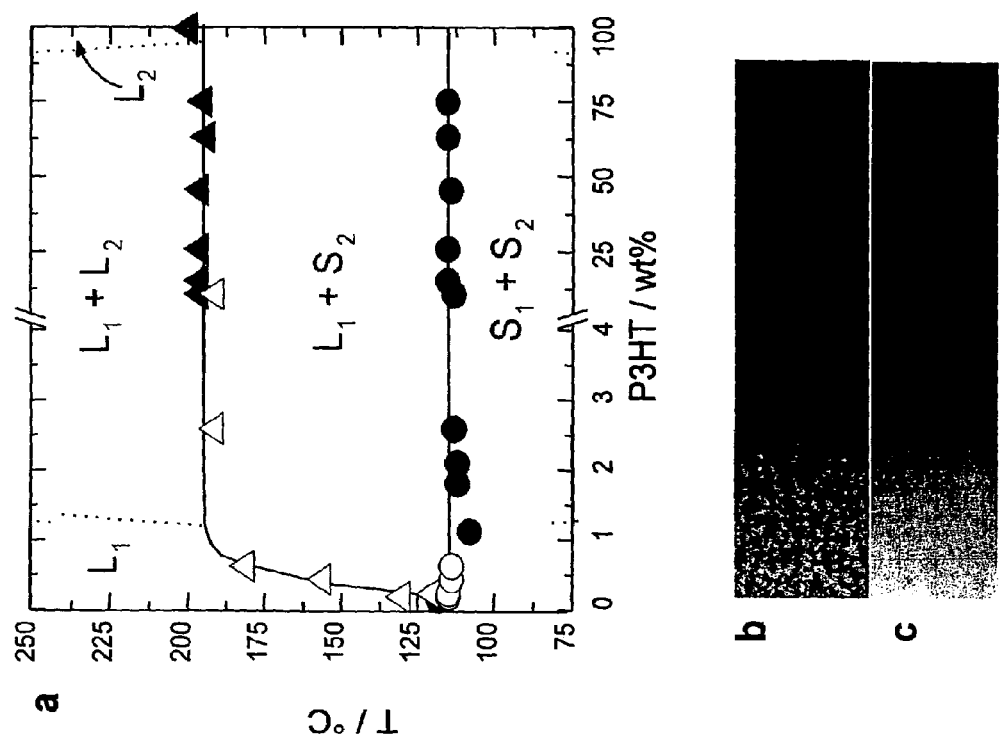
FIG. 5 shows (a) the binary non-equilibrium composition-temperature diagrams of P3HT and HDPE blends deduced from DSC peak temperatures and optical microscopy in cooling measurements. Full circles: HDPE (Mn 51,000, Mw 221,000), obtained by DSC. Full triangles: P3HT (Mn 14,000, Mw 22,000) obtained by DSC. Open circles: HDPE (Mn 21,000, Mw 91,000) obtained by optical microscopy. Open triangles: P3HT (Mn 14,000, Mw 22,000) obtained by optical microscopy. Optical microscopy under crossed polarizer (b) and without polarizer (c) of a 10 μm thin HDPE (Mn 10,000, Mw 10,000) film with a grain of P3HT (Mn 14,000, Mw 22,000) at its centre (right hand side) from which P3HT was allowed to diffuse for 30 min at 250° C.

To explain the unusual concentration dependence of the mobility in the highly crystalline P3HT/HDPE blends we have determined the binary non-equilibrium composition-temperature diagram of P3HT:PE (after evaporation of the solvent) by a combination of DSC and optical microscopy (FIG. 5). For P3HT concentrations above a critical concentration $c_{crit} \approx 1\%$ a solid P3HT phase $S_2$ crystallizes at temperatures below 200° C. and phase separates from the PE-rich melt $L_1$. When the temperature drops below the melting point of PE at 115° C. the solid PE phase $S_1$ crystallizes. When the P3HT concentration is below $c_{crit}$ the crystallization temperature for the $S_2$ phase is significantly reduced and approaches that of pure PE. This indicates that the P3HT has a limited miscibility in the PE melt. From the position of the eutectic point we deduce that about 0.5% of P3HT is miscible in PE for the molecular weights for which this phase diagram was determined (HDPE—$M_n$21k; P3HT—$M_n$14k). This finite miscibility can be observed directly when a small grain of solid P3HT is placed on top of a film of PE and the substrate is heated to above the melting point of P3HT. The P3HT can be seen to diffuse into the surrounding liquid film of PE (FIG. 5 b/c). If the P3HT was not miscible, diffusion through the molten PE film would not be possible. There appears to be a close correlation between $c_{crit}$ as extracted from the phase diagram and the P3HT concentration below which the mobility drops rapidly in the highly crystalline blends. We have found that HDPE with higher molecular weight exhibits smaller values of $c_{crit}$, and correspondingly retains high mobility values to lower concentrations than HDPE with lower molecular weight and higher values of $c_{crit}$.

Figure 7:
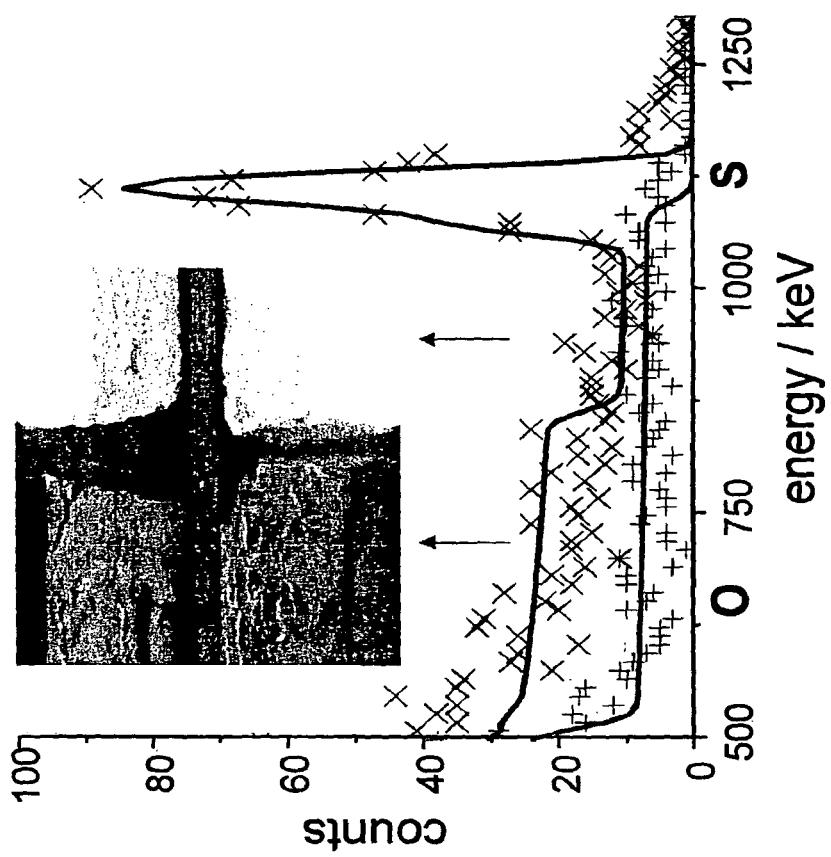
FIG. 7 shows Rutherford backscattering spectroscopy of P3HT:HDPE blends. The maximum recoil energies of $^4$He$^+$ at 170° from O and S are indicated by the elemental markers. The large peak obtained for high-mobility films in which P3HT crystallizes first shows surface segregation of P3HT which is absent for the same material processed under conditions where the PE crystallizes first. Inset: cross section photograph of a 4 mm thick 10 wt % P3HT:HDPE blend film.

Using Rutherford Backscattering Spectroscopy (RBS) we have analysed the composition of the films as a function of depth (FIG. 7). In high-mobility films there is unambiguous evidence for the existence of a segregated layer of P3HT both on the surface of the film as well as at the interface with the substrate. The latter was observed more clearly by lifting the film of the substrate and flipping it over (data not shown). We note that films processed under conditions in which the PE crystallized before the P3HT exhibit a depth independent sulfur signal. This suggests a uniform distribution of the P3HT throughout the thickness of the film consistent with the poor electrical transport. The formation of a P3HT layer at the surface and interface can also be observed by optical microscopy on very thick (4 mm) blend films of a P3HT: HDPE (1:9) blend (FIG. 7 inset). When fracturing the film to expose a cross section a red layer can be observed at both the surface and the interface of the film as well as on the surface of voids inside the film (left side of image, inset FIG. 7). For films with concentrations below $c_{crit}$ P3HT segregation to the surface is not observed (right side of image, inset FIG. 7).

These observations suggest the following explanation for the unusual concentration dependence of the mobility in blends of polymer semiconductors with highly crystalline binder polymers. For concentrations well above $c_{crit}$ there is enough P3HT in the blend that a solid phase of pure P3HT ($S_1$) is formed at the growth temperature of the film after removal of the solvent. These P3HT crystallites are embedded in the still molten binder. When the binder crystallizes they are driven to the surface and interface of the film by the strong enthalpic forces that expel the P3HT chains out of the growing binder crystals. In such a vertically stratified structure a continuous film of P3HT is formed at the interface with the gate dielectric and is able to maintain undegraded field-effect mobility as long as there is enough P3HT in the film to form this continuous layer at the interface. This explains the critical role of the crystallinity of the binder polymer, since in an amorphous system the driving force for the formation of a vertically stratified structure is expected to be much weaker. Once the concentration of P3HT becomes comparable to $c_{crit}$ there is less and less material available for formation of this phase, because an increasing fraction of the available P3HT is dissolved in the binder melt. Upon crystallization of the binder, the dissolved P3HT is not able to form a continuous pathway for charge transport, since it is uniformly distributed in the binder film at a concentration for which no percolating path can be formed. This explains the rapid drop of the mobility as the concentration of P3HT approaches $c_{crit}$. We note that a similar explanation is expected to hold for the diblock copolymer as well, where evidence for a surface and interface segregated layer of P3HT was also obtained in RBS, although this was found to be less pronounced than in the blend case. This is likely to be due to the absence of long range phase separation forcing the P3HT to be more evenly distributed in the PE film.

Figure 8:
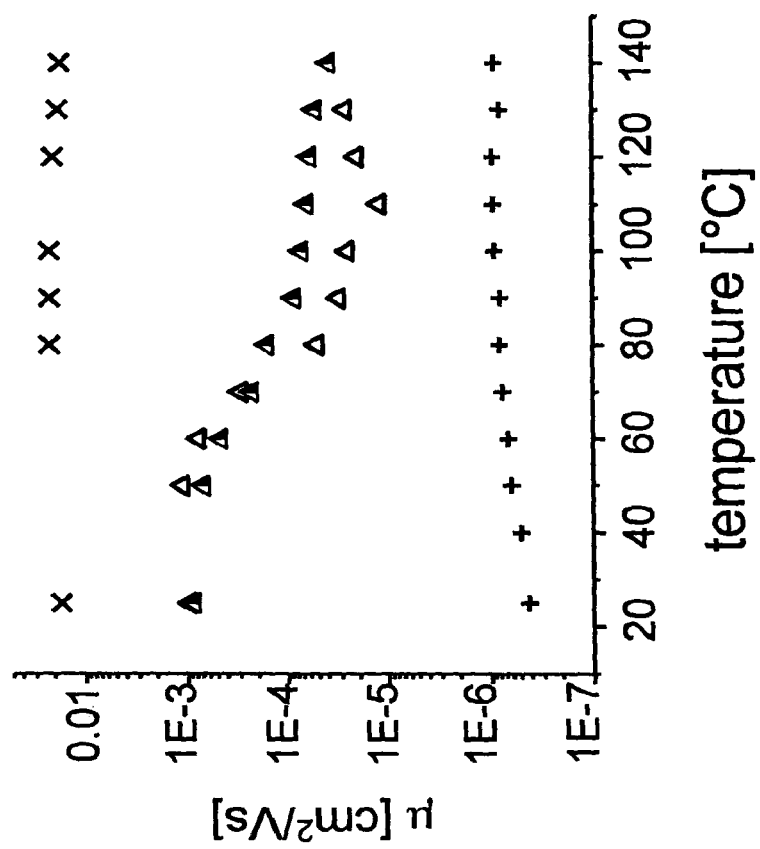
FIG. 8 shows Mobility vs. temperature of films deposited form xylenes at 120° C., heated to 140° C. and cooled down to room temperature. Diagonal crosses: pure P3HT, open triangles: P3HT:PE (5:95) blend, closed triangles: P3HT:PE (1:9).

Further supporting evidence for this model was obtained by measuring the FET performance during the process of film formation. Films were drop-cast on the FET probe station and FET characteristics were measured at elevated temperature once the solvent had evaporated. The substrate temperature was then lowered slowly to room temperature, while FET mobility was determined as a function of decreasing temperature (FIG. 8). Clean FET characteristics with mobilities around $5 \cdot 10^{-5}$ cm$^2$/Vs were observed at 140° C., which is clear evidence that a solid phase of P3HT is already present at these temperatures. Upon cooling we observe an increase in mobility by 1-2 orders of magnitude which sets in once the temperature drops below the onset of PE crystallization as determined by DSC (110-115° C.). In contrast, in pure P3HT reference samples a much weaker temperature dependence is observed. This is clear evidence that the charge transporting pathway which is responsible for the high mobilities in the blends forms upon crystallization of the PE, when the solid phase of P3HT is expelled towards the interface.

We have also obtained evidence that the blend devices with low concentration of P3HT exhibit significantly improved environmental stability than pure P3HT devices. P3HT is known to exhibit doping-induced instabilities upon exposure to air and light. We compared the operational lifetime of the bottom-gate devices with pure P3HT and P3HT/PE active layer. In the case of pure P3HT exposing the devices to air and light led to a rapid degradation of the ON-OFF current ratio, and rapid increase of the OFF current. Devices with the P3HT/PE blend active layer could be stored in air and light for a number of days before a shift of the onset voltage of the device to more positive values was detected. This is clear indication that the environmental stability of P3HT can be improved significantly by blending. Our approach is equally applicable to other semiconducting polymer, including polythiophene based copolymers, such as, but not limited to, poly(2,5-bis(3-alkylthiophen-2-yl) thieno[3,2-b]thiophene (McCullouch et al., Nature Materials 5, 328 (2006)) or poly[5,5_-bis(3-alkyl-2-thienyl)-2,2_-bithiophene] (Ong, et al., J. Am. Chem. Soc. 126, 3378 (2004)). These have improved environmental stability compared to P3HT, and using the blend approach according to the present invention further improvements in stability can be achieved in order to meet reliability requirements for applications with these materials.

Example 3

Crystalline-Crystalline P3HT-Polyethylene Block Copolymers

There has been increased interest in block copolymers comprising a conjugated and an amorphous polymer block, with the aim to combine the excellent electronic properties of the former with the potentially superior mechanical and processing properties of the later. The submicrometre-scale structures of such block copolymers driven by microscale phase separation of the covalently attached blocks are known to range from spheres, rods to co-continuous phases or lamellae, largely depending on the relative volume fraction of its components (Park, C. et al., Polymer 44, 6725 (2003)). Unfortunately, so far, the electronic properties of such block copolymers were reported to deteriorate rapidly with decreasing conjugated polymer content thereby failing to exhibit the concomitant qualities of both blocks. Block copolymers comprising two crystalline parts have been shown to provide a broader range of processing options. The microstructure of such block copolymers depends on their composition as well as the crystallisation of either moiety which in turn may strongly influence the ability of the second block to subsequently crystallise (Liu, et al., Angewandte Chemie International Edition 41, 329 (2002)).

A series of P3HT-PE block copolymers with different compositions were synthesized and characterised according to procedures reported in Radano, C. et al. J. Am. Chem. Soc 127, 12502 (2005). Here, we disclose the different processing options available with these polymers and examine the influence of the block composition on selected electronic properties. In Table 1 selected physical properties of the block copolymers, as well as of the P3HT and PE reference materials are listed.

for instance in xylene, rather than from the melt Table 1 reveals that, not surprisingly, also the present block copolymers exhibit end melting temperatures that approach that of the P3HT homo-polymer. Therefore, in this work we process the materials from solution. As the presented P3HT-PE block copolymers comprise entities with conspicuously different chemical and physical properties including melting temperature and dissolution behaviour, the phase diagrams of the new materials and xylene were determined.

TABLE 1

Selected properties of P3HT-PE block copolymers.

| P3HT-PE wt %-wt % | $M_w$ [kg/mol] | $M_n$ [kg/mol] | $M_n$(P3HT) [kg/mol] | $T_m$(P3HT) [° C.] | $T_m$(PE) [° C.] | Mobility [cm2/Vs] | on-off ratio | appearance solution |
|---|---|---|---|---|---|---|---|---|
| 100-0 | 22 | 14 | 14 | 220 | - | 0.01 | - |  |
| 35-65 | 94 | 74 | 19 | 231 | 128 | 0.05 | - |  |
| 0-90 | 140 | 93 | 13 | 213 | 130 | 0.02 | - |  |
| 5-95 | 197 | 121 | 13 | 211 | 134 | 0.0004 | - |  |
| 0-100 | 120 | 101 | - | - | 135 | - | - |  |

P3HT-PE block copolymer composition in weight percent (wt %).
$M_w$ and $M_n$: weight and number average molecular weight, respectively.
$T_m$: melting temperature.
Mobility and on-off ration: field-effect transistor characteristics, discussed later.
Appearance: photograph of 0.1 wt % 0.1 wt % solutions in xylene.

As can be seen in Table 1, the P3HT block has roughly the same number average molecular weight $M_n$ in all materials. The overall composition varies with changing PE block length. Also shown are photographs of vials containing solutions of 0.1 wt % of the different polymers in xylene taken at ~125° C. These pictures reveal the distinct colour of dissolved copolymers and indicate that for all materials homogeneous solutions can be obtained.

Figure 9:
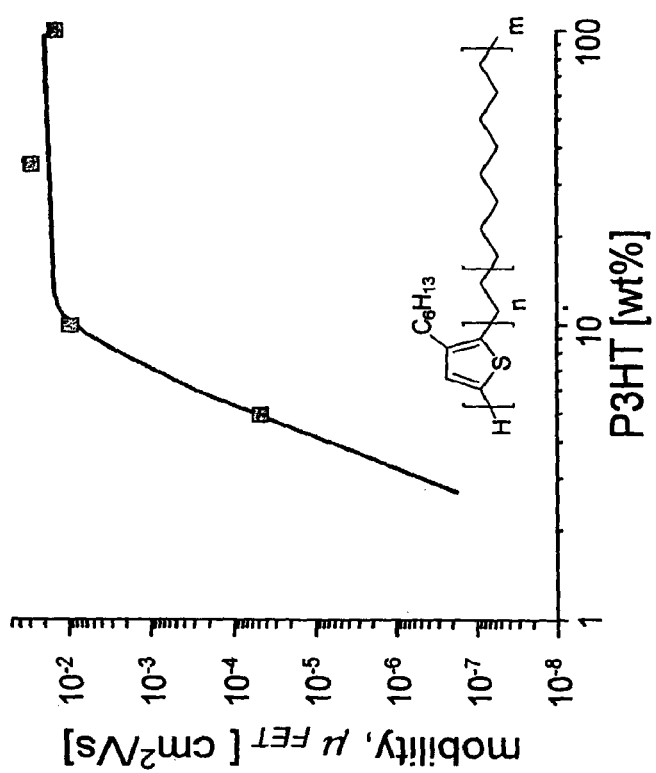
FIG. 9 shows the mobility as a function of P3HT concentration in diblock copolymers of P3HT and HDPE.

The electrical transport in such blockcopolymer films was studied in standard bottom-gate FET configurations by drop-casting the blockcopolymer solution onto a heated hexamethyldisilazane (HMDS) treated Si—SiO$_2$ with pre-patterned Au source and drain electrodes (L=20 μm, W/L=500). The substrate temperature was varied between 120-160° C. The dependence the dependence of the mobility on the P3HT:PE composition is shown in FIG. 9. The composition dependence of the mobility is similar to the one observed in the case of P3HT:PE blends as described above in Example 2. When the weight percentage of the P3HT is above 10% a high mobility value of $1 \cdot 10^{-2}$ cm$^2$/Vs is obtained, similar to that of pure P3HT of the same molecular weight. Only when the weight percentage of the P3HT drops below 10% do we observed a rapid decrease of the field-effect mobility. This is clear evidence that using a crystalline block linked to the P3HT the previously observed degradation of electrical performance upon copolymerization of the electroactive polymer with a dielectric block can be avoided (Liu, et al., Angewandte Chemie International Edition 41, 329 (2002)).

We also observed the mobility to be dependent on the deposition temperature. At deposition temperatures of 140-160° C. even higher mobilities approaching $6 \cdot 10^{-2}$ cm$^2$/Vs were measured.

Figure 10:
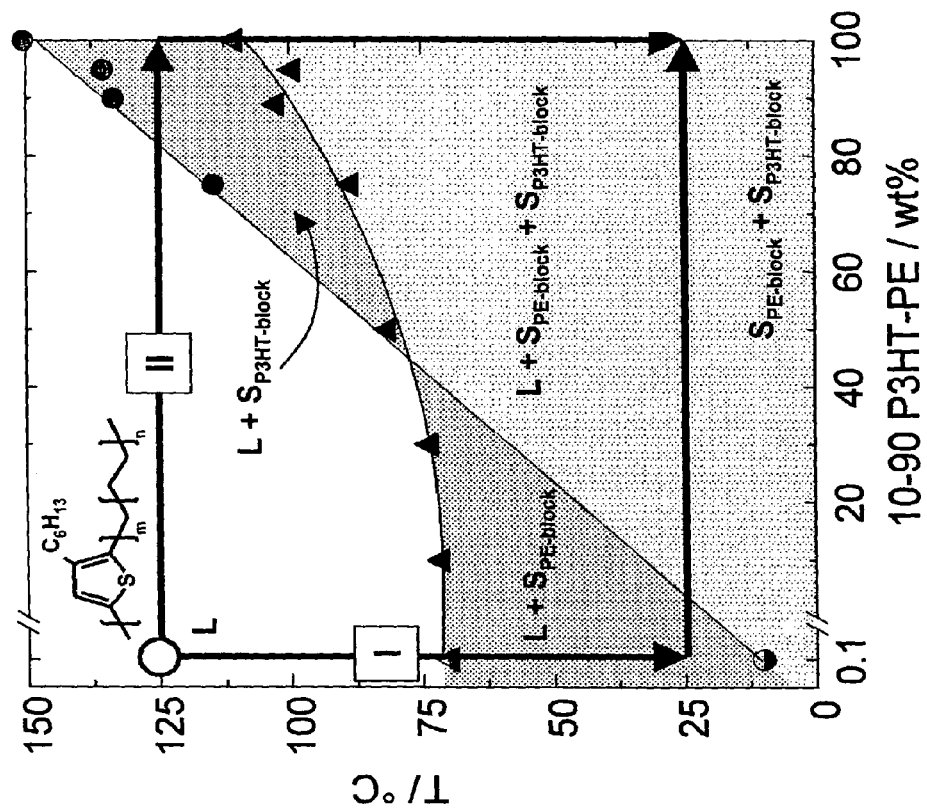
FIG. 10 shows the binary non-equilibrium composition-temperature diagram of 10-90 P3HT-PE and xylene. Schematic processing pathways are represented by I blue and II red arrows both starting from L, dilute solution of P3HT-PE in xylenes and finishing at SPE-block+SP3HT-block. Crystallisation temperatures are deduced from peak temperatures in differential scanning calorimetry (DSC) cooling thermograms (solid symbols) and visually, exploiting the thermochromic properties of P3HT (half filled symbols). Triangles: PE; Circles: P3HT.

Many common crystalline polymers, such as PE, can be conveniently processed at elevated temperatures from the melt. However, because of the high melting temperature and limited high-temperature stability of P3HT, it has become common practise to process this material from solution, as FIG. 10 shows, as an example, the binary temperature-composition diagram of the block copolymer, comprising 10 wt % P3HT and hereafter denoted 10-90 P3HT-PE and xylene, constructed from differential scanning calorimetry (DSC) cooling thermograms and optically, exploiting the thermo-chromic properties of P3HT. Other high boiling point solvents such as decalin, cyclohexanone and chlorobenzenes exhibited similar phase behaviour in combination with P3HT-PE. The non-equilibrium phase diagrams in FIG. 10 reveals two distinct regimes. In solutions of up to ~45 wt % of the copolymer, the P3HT block is soluble, below 5 wt % even at room temperature, whereas the PE block is not. By contrast, in more concentrated solutions the phase behaviour of the two blocks is reversed and a regime exists where the PE block is soluble but the P3HT block is not. Note the absence of thermal transitions of the P3HT block in the less concentrated regime, which appears to suggest that under the experimental conditions applied, the P3HT block does not form ordered structures that exhibit a detectable DSC exotherm.

This particular phase behaviour evidently provides two processing schemes, both starting from dilute, homogeneous solution, schematically depicted in FIG. 10, leading to distinctly different structures. In the processing scheme marked I, the block copolymer solution first is cooled to room temperature, i.e. without a change in composition, causing the PE block to crystallise whereafter the solvent is allowed to evaporate. In contrast, in processing scheme II, the polymer solution is kept at elevated temperatures (above ~100° C.) until the solvent has evaporated before the material is cooled to room temperature, resulting in crystallisation of the P3HT block prior to the PE moiety. These two processing paths are expected to lead to solids with principally different structures, because of the reverse crystallisation sequence of the P3HT and PE block.

Figure 11:
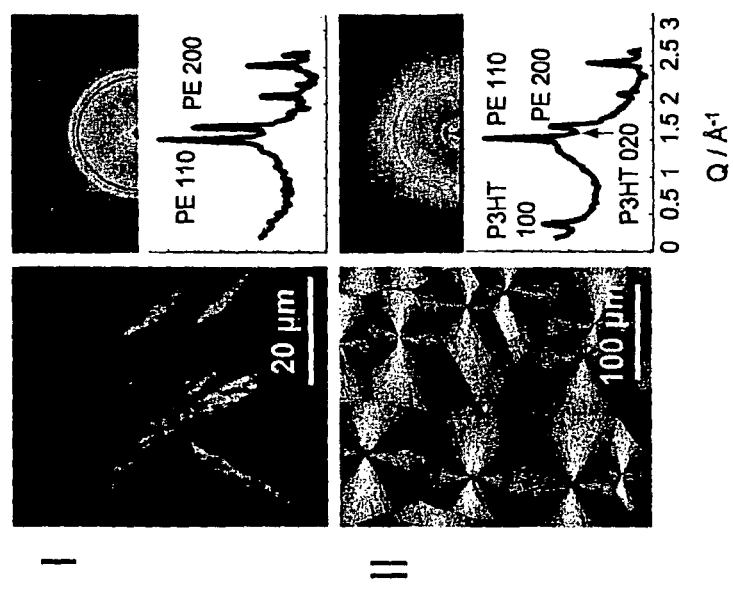
FIG. 11 shows optical micrographs, WAXS, GIXD, TEM and ED of P3HT-PE block copolymers processed by scheme I (top) and II (bottom), respectively, starting from homogeneous 0.1 wt % solution in xylene at ~125° C. unless otherwise stated. a. Left panel: polarised optical microscopy of 10-90 P3HT (top-left: crystallisation from very dilute 0.01 wt % solution in xylenes), Right panel: WAXS (top) and GIXD (bottom).

FIG. 11 reveals the indeed fundamentally different morphologies of solid-solid 10-90 P3HT-PE obtained by the two processing schemes. The top left photograph, taken between crossed polarisers, shows material prepared from highly-dilute 0.01 wt % solution via processing route I. Crystallisation of the PE block leads to a classical single-crystal type structure. By contrast, the bottom left photograph shows thin films of the same P3HT-PE copolymer cast from dilute 0.1 wt % solution and prepared via processing route II. In this case, spherulitic structures typical of many crystalline polymers can be discerned. In addition to the difference in microscopic morphologies, the P3HT-PE copolymers processed according to the two schemes also exhibit major differences in crystalline order, most notably of that of P3HT. In FIG. 11 right panels, wide angle X-ray scattering (WAXS) and grazing angle incidence diffraction (GIXD) of films processed via both schemes are depicted. In both cases, PE 110 and 200 reflections are present. However, the common P3HT 100 and 020 reflections could be clearly detected only in samples prepared via scheme II.

Figure 12:
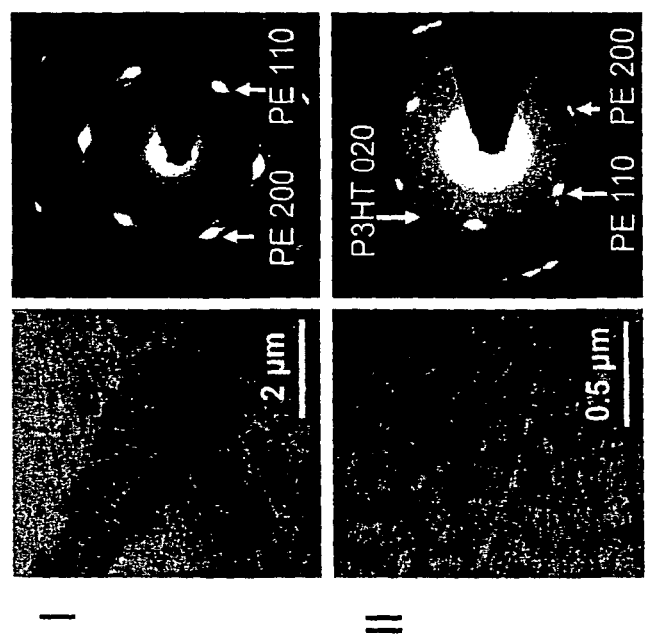
FIG. 12 shows transmission electron microscopy (TEM) images of 35-65 P3HT-PE (left panel) and electron diffraction (ED) (right panel). Top image and corresponding ED taken of samples prepared from 0.01 wt % solution in xylene.

Similar morphological and structural features were found in solution processed samples of the other copolymers, as illustrated in FIG. 12. The top picture of FIG. 12 shows a transmission electron microscopy (TEM) picture of the 35-65 P3HT-PE copolymer processed via route I crystallised from a 0.01 wt % solution. This TEM micrograph again reveals classical PE single-crystal type structures and the electron diffraction (ED) pattern shows strong PE 110 and 200 diffractions (FIG. 12 top-right). Note the apparent absence, however, of the characteristic 020 diffraction of P3HT. Furthermore, in TEM images, darker regions, which we attribute to poorly ordered P3HT, can be discerned. The TEM image of the same P3HT-PE copolymer processed into thin films via route II, again reveals highly crystalline PE lamellae, and ED the strong PE 110 and 200 diffraction (FIG. 12 bottom left and right, respectively). These PE lamellae, at a larger scale, are organised into typical spherulitic super-structures, clearly visible in polarised optical microscopy (FIG. 11 bottom-left). By contrast, however, ED revealed, unlike above, a continuous P3HT 020 diffraction ring indicative of substantial order of the P3HT blocks and the absence of preferred orientation with respect to the PE lamellae.

Figure 13:
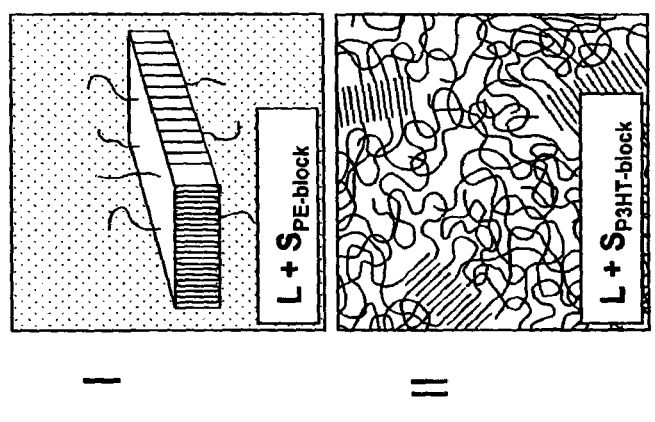
FIG. 13 shows a schematic representation of copolymers in the two semi-solid regimes.

These observations strongly suggest and are consistent with the formation of two fundamentally different structures, depending on the processing route, as schematically shown in FIG. 13 for the copolymers in their semi-solid phase. As is evident from the temperature composition diagram in FIG. 11, scheme I causes the PE block to crystallise first, restricting the mobility of the P3HT moieties, which lead to reduced, if any, crystalline order of P3HT during subsequent solidification. By contrast, scheme II induces the P3HT block to crystallise prior to the PE block, leading to highly ordered lamellae of the conjugated, semiconducting part of the block copolymer.

Figure 14:
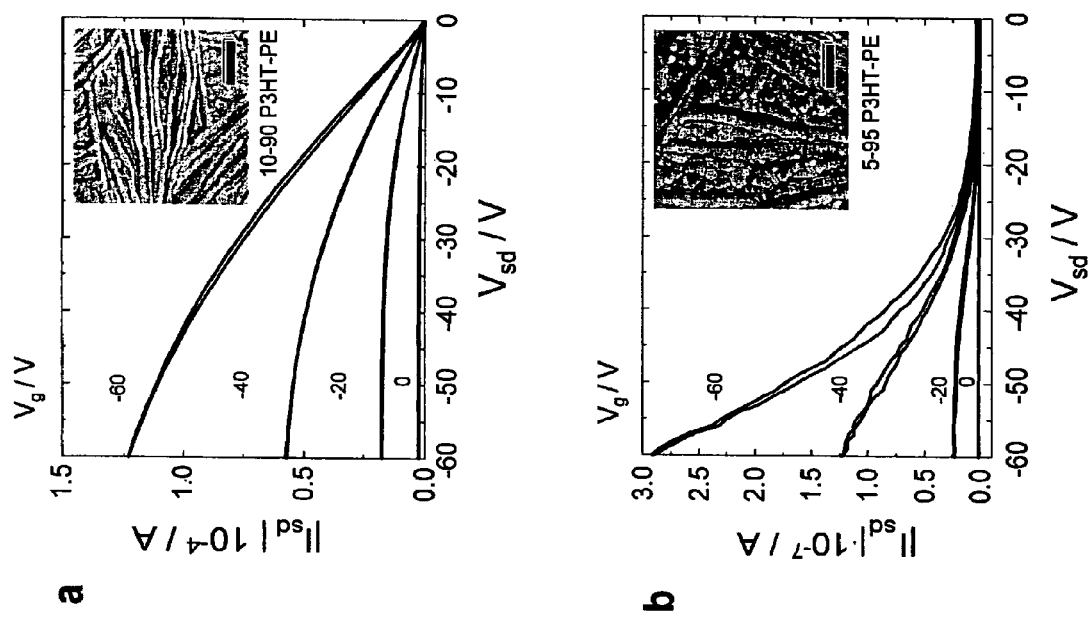
FIG. 14 shows the output field effect transistor device performance: a: Characteristics of FETs comprising thin films of 10-90 P3HT-PE processed by scheme I and II. b: Characteristics of FETs comprising thin films of other polymers processed via scheme II. AFM insets, right panel. Tapping mode scans for 10-90 P3HT-PE and 5-95 P3HT-PE.

In order to explore the influence of these different structures on the semiconducting characteristics of the P3HT-PE block copolymers, we studied their performance in a bottom-gate, bottom-contact field-effect transistor FET device configuration. We found clear evidence that processing route II, in which the semiconducting polymer crystallizes first, leads to significantly better device performance than route 1. FIGS. 14a and b show typical FET transfer and output characteristics of thin films of 10-90 P3HT-PE processed via route I and II, respectively. FETs comprising thin films processed via scheme I where found to exhibit very poor FET performance. The FET mobility is very low (typically $<10^{-5}$ cm$^2$/Vs) and evidence for strongly non-linear output characteristics was found, possibly an indication that under these conditions the microstructure of the film is such charges need to move across barriers of PE leading to a strong field-dependence of the mobility or a large contact resistance. In contrast those based on thin films processed via scheme II showed excellent FET performance with mobilities on the order of $10^{-2}$ cm$^2$/Vs. Considering the well-known fact that the degree of crystallinity is critical for the semiconductor properties of P3HT (Sirringhaus et al., Nature 401, 685 (1999)), this observation is consistent with the above described structural characteristics of the different copolymer films. P3HT homo-polymer thin films fabricated the same way and in the same device configuration showed saturated mobilities of 0.01 cm$^2$/Vsec only, suggesting equal or superior performance of P3HT-PE. Thin films of P3HT-PE copolymers containing only 5 wt % of the P3HT block showed a significant deterioration in charge carrier mobility, hysteresis, on-off ratio and contact resistance, suggestive of a breakdown in connectivity between the P3HT domains (FIG. 9). Atomic force microscopy (AFM) tapping mode images of thin films processed via route II corroborate this: films of 10-90 P3HT-PE show continuous, highly ordered structures when compared to films of the 5-95 P3HT-PE block copolymer, the structure of which appears more discontinuous (insets FIGS. 14 a and b).

Using Rutherford Backscattering Spectroscopy (RBS) we have analysed the composition of the films as a function of depth. In high-mobility films there is unambiguous evidence for the existence of a segregated layer of P3HT both on the surface of the film as well as at the interface with the substrate. The amount of segregation is somewhat less pronounced than in the case of blends, which is believed to be due to the constraints on the mobility of the P3HT blocks imposed by the covalent link with the dielectric block. Nevertheless, a segregated layer is detectable at both the surface and the interface of the film, which is responsible for the excellent charge transport properties even for small semiconducting block length. We note again that films processed under conditions in which the PE crystallized before the P3HT exhibit a depth independent sulfur signal. This suggests a uniform distribution of the P3HT throughout the thickness of the film consistent with the poor electrical transport.

This example clearly shows that using a crystalline dielectric block linked to the active semiconducting block the previously observed degradation of electrical performance upon copolymerization of the electroactive polymer with a dielectric block can be avoided (Liu, et al., Angewandte Chemie International Edition 41, 329 (2002)). It also shows that the order in which the two blocks are crystallized is crucial. In order to achieve good performance, the two blocks and the processing condition need to be selected such that the active semiconducting solidifies/crystallizes before the dielectric block.

Example 4

Figure 15:
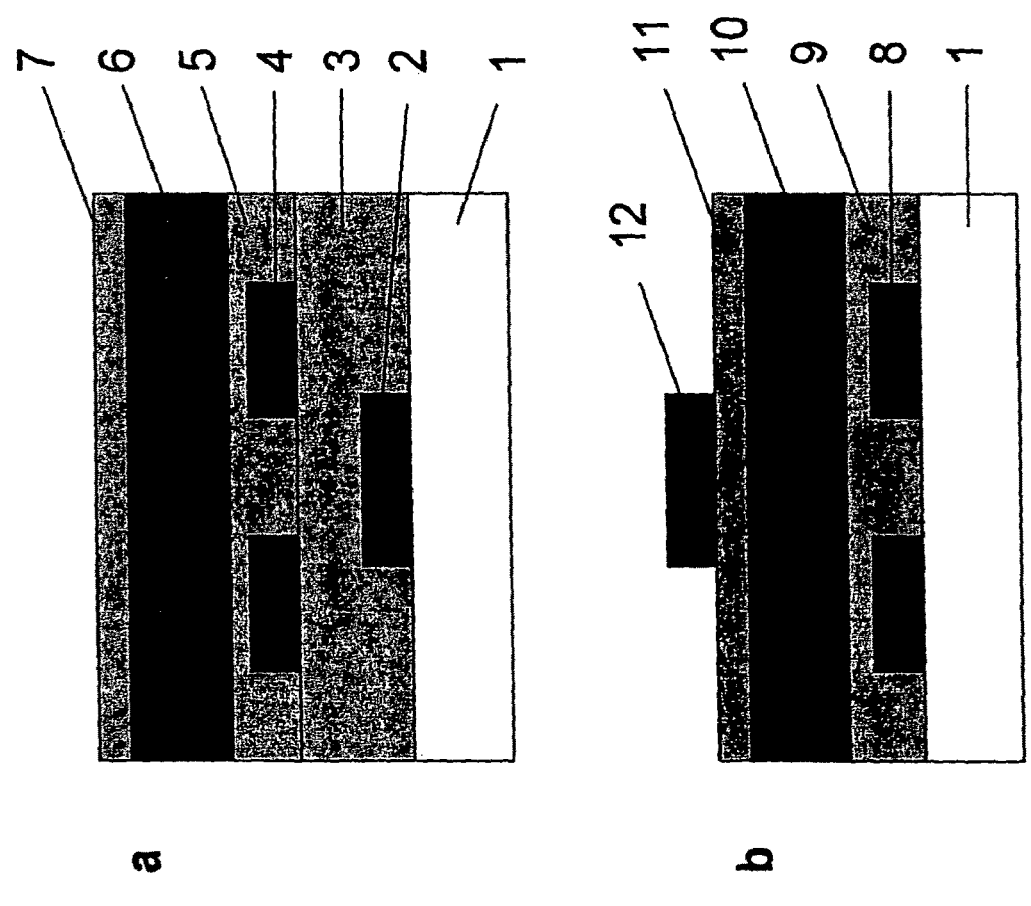
FIG. 15a shows a schematic diagram of an electronic switching device.
FIG. 15b shows a FET device fabricated from a vertically stratified bilayer structure.

Fabrication of Vertically Stratified Polymer Semiconductor-Crystalline Gate Dielectric Bilayers In Examples 1 and 2 we have demonstrated a method for forming vertically stratified bilayers, in which the semiconducting polymer is driven towards the surface of the film and the interface with the substrate during the crystallization of the binder polymer. This technique can be used to fabricate devices in which the crystalline binder forms the gate dielectric of the transistor (FIG. 15b). Such vertically stratified bilayer structures have been used previously for fabrication of organic FET devices (Chua, et al., Advanced Materials 16, 1609 (2004)), however the specific method disclosed previously relied on general surface tension driven assembly of a ternary blend solution, and not on crystallization-driven assembly as disclosed here. On a substrate 1 source and drain electrodes 8 are deposited and patterned by a suitable patterning technique such as, but not limited to, photolithography, laser ablation or direct write printing. The semiconductor/dielectric bilayer is deposited from a solution of an organic semiconductor and a crystalline dielectric polymer. The deposition conditions are selected such that the organic semiconductor crystallizes first, and is expelled to the surface and interface of the film during the crystallization of the binder polymer, as described in detail in examples 1 and 2. In this way a vertically stratified morphology with a layer of organic semiconductor 9 in contact with the source-drain electrodes, a gate dielectric layer 10, 6 and a surface layer of organic semiconductor 11 is produced. The device is completed by depositing and patterning a gate electrode 12 on the surface of the semiconductor/dielectric layer. The relative thicknesses of the semiconducting and the dielectric layer can be adjusted by varying the composition of the blend solution, but since the mobility of the organic semiconductor only degrades for semiconductor composition typically less than 5-10% a wide range of compositions is available to adjust the thicknesses to the desired values. The presence of the surface layer 11 does not impact the device performance in a significant way since it is in direct contact with the gate electrode.

Example 5

Organic Field-Effect Transistor with a Semiconductor-Gate Dielectric Block Copolymer Active Layer As shown in Example 3 using a diblock copolymer comprising a semiconducting polymer block and a crystalline polymer dielectric block vertically stratified lamellar structures can be formed in which the microscale phase separation is such that the semiconducting block is expelled to the surface/interface of the layer during the crystallization of the dielectric block. This can be used to fabricate an organic FET device in which the dielectric block of the blockcopolymer acts as the gate dielectric of the device (FIG. 15b). On a substrate 1 source and drain electrodes 8 are deposited and patterned by a suitable patterning technique such as, but not limited to, photolithography, laser ablation or direct write printing. The semiconductor/dielectric blockcopolymer is deposited from a solution. The deposition conditions are selected such that the organic semiconductor block crystallizes first, and is expelled to the surface and interface of the film during the crystallization of the dielectric block, as described in detail in examples 3. In this way a vertically stratified morphology with the organic semiconductor block 9 in contact with the source-drain electrodes, and the dielectric block 10 located on top. A surface segregated layer of the semiconducting block might also be present on the surface. a surface layer of organic semiconductor 11 is produced. The device is completed by depositing and patterning a gate electrode 12 on the surface of the semiconductor/dielectric layer. The relative thicknesses of the semiconducting and the dielectric layer can be adjusted by varying the composition of the blend solution, but since the mobility of the organic semiconductor only degrades for semiconductor composition typically less than 5-10% a wide range of compositions is available to adjust the thicknesses to the desired values. The presence of the surface layer 11 does not impact the device performance in a significant way since it is in direct contact with the gate electrode. The use of such an in-plane lamellar structure of semiconducting—dielectric block copolymers is particularly attractive for organic field-effect devices that require a thin gate dielectric, for example, because of a submicrometer channel length that requires typically gate dielectric thickness below 50 nm, preferably on the order of 10-20 nm (Sele, et al., Advanced Materials 17, 997 (2005)). A particularly preferred embodiment of the present invention is a film of a semiconducting-crystalline diblock copolymer, the thickness of which is determined by a single bilayer of the semiconducting block and the dielectric block. This can be achieved by adjusting the concentration of the solution, the deposition conditions, and a suitable surface treatment of the substrate (in order to prevent the dewetting of the thin film from the substrate). Other block copolymers, such as linear triblock copolymers, or branched blockcopolymers can be used as well, and processed in the same way.

Example 5

Fabrication of Free-Standing Semiconducting Film Comprising an Organic Semiconductor and a Crystalline Binder Polymer An application which is enabled by the present invention is the fabrication of a free-standing substrate with semiconducting properties. Common polymer semiconductors such as P3HT cannot be used for fabrication of a free-standing film, since they tend to have much poorer mechanical properties and mechanical strength than commodity structural polymers such as polyethylene, polyethylene terephthalate (PET) or polyethylene naphthalate (PEN). Also, polymer semiconductors tend to have much higher cost, since the synthetic methods for them are either inherently more expensive or are less well developed than for commodity dielectric polymers. By mixing a small percentage of a semiconducting material into a crystalline polymer binder such as, but not limited to, PE, PET, PEN or polypropylene (PP) as discussed in the above examples, a substrate can be made which has mechanical properties very similar to those of the dielectric binder material itself, but has also a semiconducting functionality with good. charge transport properties. The semiconducting functionality of the substrate can be used for example for realizing electronic devices on such substrate, such as sensing devices, electronic switching devices, or devices for detecting an optical signal due to light absorption in the organic semiconductor. A free standing films might also be based on processable oligomeric and small molecular binder materials.

Example 6

Blends of HDPE with the Small Molecule Organic Semiconductor quarterthiophene (4T-HDPE)

The method according to the present invention can also be applied to blends of crystalline binder polymers with small molecule organic semiconductor. Here we demonstrate this with α-quaterthiophene. Among existing (non-substituted) oligothiophenes, α-quaterthiophene offers a good trade-off between electronic properties and processability in terms of the material's melting temperature and solubility. Oligothiophenes comprising five thiophene units and more, on the other hand, although interesting for their superior electronic characteristics, display inconveniently high melting temperatures in excess of 250° C.

Differential scanning calorimetry (DSC) of α-quaterthiophene indicates that melt processing requires also relatively elevated temperatures >215° C., with sublimation commencing at similar temperatures. This allows, accordingly, only a relatively small processing window. However, in contrast to its higher homologues, 4T permits relatively straight-forward solution processing. For instance, for concentrations up to ~10 wt %, dissolution temperatures <~140° C. of this species are found in common non-chlorinated benign solvents such as decalin, with corresponding crystallization temperatures of $T_c$<110° C. Such solutions were found to be thermally rather stable (as confirmed by nuclear magnetic resonance (NMR), contrary to those of other conjugated oligomers, such as the polycyclic tetracene and pentacene.

4T:HDPE blends formed homogenous dilute solutions in decalin at elevated temperatures. In contrast to the P3HT:PE binaries described above, for which two different solidification sequences can be induced (i.e. P3HT crystallizing prior to PE and vice versa), we found that 4T exhibits a higher crystallization temperature than PE at all concentrations explored and, accordingly, invariably crystallized prior to the polymer. Conveniently, this is the crystallization sequence most favourable to yield high-mobility, low-percolation threshold systems.

Hence, the 4T:HDPE blends allowed us to explore the influence of different rates of solidification on the microstructures induced and, in turn, their influence on the electronic properties of the blends. For this purpose we followed two processing pathways: In scheme I, hot solutions of the two components were cast at ambient, followed by solvent evaporation at that same temperature, causing the materials to slowly crystallize from dilute solution. "Flash"-removal of the solvent was conducted at elevated temperature of ~130° C. (scheme II), which resulted in faster crystallization of 4T from more concentrated viscous liquids, followed by solidification of the polymer.

Casting and solvent removal at ambient resulted in coarse microstructures, while 4T:HDPE films produced at elevated temperatures (i.e. fast solvent removal) featured a distinctly finer and more homogenous distribution of the semiconductor.

A significant influence of the rate of solidification was also found on the phase behaviour of binary 4T:HDPE mixtures. All temperature/composition diagrams indicate simple monotectic phase behaviour with a miscibility gap of the two components over a wide range of temperatures and compositions. However, the melting-, dissolution- and crystallization temperatures of the semiconducting species were significantly affected by the manner in which the 4T:HDPE blends were produced. Considerably lower values of both, $T_m$ and $T_c$ of 4T were recorded in blends obtained by casting at elevated temperatures, consistent with a smaller crystal and domain size of this species.

As the processing pathway selected is likely to affect also molecular order—known to potentially influence semiconducting properties of conjugated species—wide-angle X-ray scattering (WAXS) was performed on the differently processed 4T:HDPE blends, as well as neat 4T and HDPE references. For the binary mixtures, diffractions resulting from both individual components were observed. Neat 4T crystallized as the low temperature polymorph when processed according to scheme I and as the high temperature version via route II, as was also found for 4T in the blends with HDPE. For α-oligothiophenes of even number of thiophene units, however, charge-transport characteristics were reported to be little affected by the polymorph, and, hence, here of lesser concern.

In a first set of experiments, electronic properties of thin films of 4T:HDPE blends were examined in bottom-gate bottom-contact FET-configurations. Small source-drain currents were recorded in transistors based on 4T:HDPE produced by slow solvent removal at ambient. Mobilities in such films were estimated to be less than $10^{-6}$ cm$^2$/Vs.

In sharp contrast, clean FET characteristics were observed for devices comprising 4T:HDPE layers produced at elevated temperatures. In fact, current modulations of $10^3$ and charge-carrier mobilities of ~1×10$^{-4}$ cm$^2$/Vs were measured for blends comprising 10 wt % 4T. This is comparable with $\mu_{FET}$ values reported for vapour-deposited neat α-quaterthiophene.

Electronic characteristics deteriorated rapidly when the semiconductor content in 4T:HDPE binaries was reduced to <~10 wt %. Charge-carrier mobilities of <$10^{-6}$ cm$^2$/Vs were obtained for these devices, and a distinct shift of the threshold voltage, $V_{th}$, of ~15 V was observed. This indicates that a barrier may have formed preventing efficient injection of charge carriers from the source-drain electrodes into the active layers that comprised larger concentrations of insulator.

Importantly, FET performance comparable to that of neat 4T was recorded with devices based on 4T:HDPE binaries that were processed via scheme II and (at elevated temperatures) featured liquid-liquid phase separation. In contrast, blends in which the two components were miscible in the liquid state showed rapidly deteriorating charge-transport with decreasing semiconductor content, with device performance similar to that found for FETs based on active layers displaying large-scale phase separation, as induced by solidification scheme I.

The processes and devices described herein are not limited to the materials discussed in any of the above examples. The method appears to be generally applicable: We have observed similar transport properties in a range of other organic semiconductors when blended with a crystalline polymer binder, such as poly([2-methoxy-5-(3',7'-dimethyloctyloxy)]-p-phenylene vinylene (OC$_1$C$_{10}$-PPV), but also small molecule semiconductors such as rubrene and tetracene blended with HDPE. Preferably the organic semiconductor is a crystalline material, however, also semicrystalline as well as amorphous materials can be used. Preferably the organic semiconductor solidifies at a temperature above the melting point of the dielectric binder polymer. Possible materials that may be used for the electroactive semiconducting layer, includes any solution processable conjugated polymeric or oligomeric material that exhibits adequate field-effect mobilities exceeding 10$^{-3}$ cm$^2$/Vs and preferably exceeding 10$^{-2}$ cm$^2$/Vs. Materials that may be suitable have been previously reviewed, for example in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)).

The invention is also applicable to other solution processible semiconductors, such as inorganic colloidal nanoparticles, such as, but not limited to ZnO, CdSe, or Si ((B. A. Ridley, et al., Science 286, 746 (1999)) which can be dispersed in solvent together with a binder.

Other crystalline binder polymers such as polyethylene oxide (PEO) and PP have also been used successfully. Examples for other crystalline or semicrystalline binder polymers are polyesters such as PET and PET. There is potentially a very large range of crystalline or semicrystalline binder polymers that can be used. An overview over the different materials and their processing is given in Wunderlich, Macromolecular Physics, Vol 1-3, New York, London; Academic Press 1973. The binder polymer (in the case of blends) or the second block (in the case of blockcopolymer) does not need to be a dielectric polymer.

It might also be a crystalline semiconducting polymer blended/copolymerized with an electroactive organic semiconductor. In this case the electroactive organic semiconductor is assumed to have energy level that are located such with respect to those of the binder polymer that charge transport occur preferentially in the electroactive polymer.

The binder polymer is preferentially a low k polymer with a dielectric constant less than 3.5, preferably less than 3. This is avoid disorder-induced broadening of the density of states of the electroactive semiconductor by dipolar disorder in the binder component.

The present invention is applicable to a broad range of device architectures including bottom-gate, top-contact and bottom-contact devices. Since the segregation of the electroactive semiconducting component occurs to both the surface and the interface of the device also top-gate architectures can be used. As gate dielectric layer a broad range of solution- or -vapour phase deposited dielectrics can be used, such as, but not limited to, $SiO_2$, or $SiN_x$ or polymer dielectrics, such as PMMA, polyvinylphenol, and other gate dielectrics known in the literature (see for example, Facchetti et al., Adv. Mat. 17, 1705 (2005)). Electrodes can be fabricated from a broad range of materials, including vapor phase deposited metals, conducting polymers, or printable metal nanoparticle inks. Patterning of the various layers of the device, including the active semiconducting layer, might be by subtractive patterning such as photolithography, nanoimprinting or laser ablation, or by additive patterning, such as inkjet, offset, gravure, flexographic or screen printing (Forrest, et al. Nature 428, 911 (2004)). Although preferably all layers and components of the device and circuit are deposited and patterned by solution processing and printing techniques, one or more components may also be deposited by vacuum deposition techniques and/or patterned by photolithographic processes.

Figure 16:
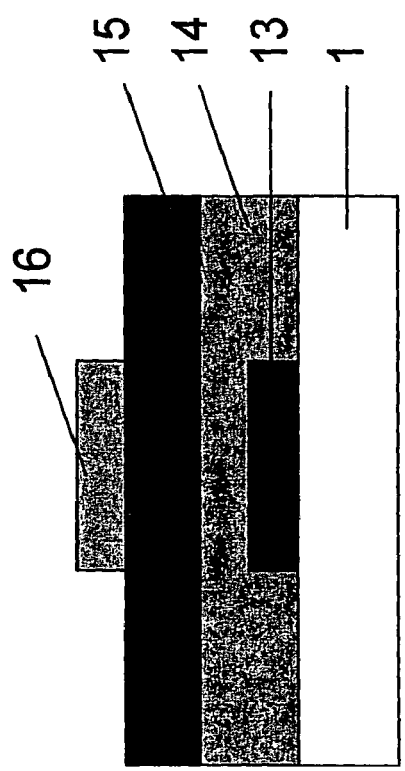
FIG. 16 shows a device configuration suitable for a photovoltaic cell.

The method disclosed here to produce vertically stratified morphologies in polymer blends and blockcopolymers can also be applied to other device configurations, such as photovoltaic cells, in which bilayer morphologies with a layer of hole transporting polymer underneath a layer of electron transport polymer (or vice versa) are needed to ensure efficient charge collection of charges generated at the interface between the two polymers (Arias et al., Macromolecules 34, 6005 (2001)) (FIG. 16). In this case the blend might comprise a crystalline hole transporting polymer 14 with a low/high melting point, and a crystalline electron transporting polymer 15 with a higher/lower melting point. In this case the film can be processed in such a way that the polymer which is supposed to be in contact with the anode 13 on the substrate is crystallized first, and is driven to the interface with the substrate. The electron transport polymer is located on the top, and is in contact with a cathode 16. In this case the presence of a surface layer of the hole transporting polymer on top of the electron transport layer should be avoided in order not to block the collections of electrons in the cathode. This can be achieved, for example, by adjusting the relative surface tension of the substrate, and the surface tensions of the two polymers in such a way that segregation of the hole transporting polymer during the crystallization of the electron transporting is preferably directed towards the interface, as opposed to the free surface of the film. Alternatively, the two polymers might be selected such that it is possible to wash off a top surface layer of the hole transporting polymer in a solvent in which the electron transport layer underneath is not soluble. It should be noted that the reverse structure in which the hole transporting polymer is located on top of the electron transporting polymer can be fabricated in an analogous way.

Devices such as TFTs fabricated as described above may be part of more complex circuits or devices, in which one or more such devices can be integrated with each other and/or with other devices. Examples of applications include logic circuits and active matrix circuitry for a display or a memory device, or a user-defined gate array circuit.

The present invention is not limited to the foregoing examples. Aspects of the present invention include all novel and inventive aspects of the concepts described herein and all novel and inventive combinations of the features described herein.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. An electronic device comprising a semiconducting body, the body comprising:
   an organic semiconducting material; and
   a crystalline binder material,
   wherein the semiconducting material is at least partially segregated from the binder material and concentrated at an outer portion of the semiconducting body, and the binder material is concentrated at an inner portion of the semiconducting body,
   wherein the device is a transistor, and wherein the organic semiconducting material concentrated at the outer portion of the semiconducting body constitutes a continuous path for charge transport through the organic semiconducting material from a source electrode of the transistor to a drain electrode of the transistor, and
   wherein the semiconducting body defines a geometric plane and the organic semiconducting material has a lamellar structure, the lamellae being oriented so as to lie generally in that plane.

2. The electronic device as claimed in claim 1, wherein the crystalline binder material is a dielectric.

3. The electronic device as claimed in claim 1, wherein the crystalline binder material is a semiconductor or conductor.

4. The electronic device as claimed in claim 1, wherein the organic semiconducting material is a semi-crystalline polymer.

5. The electronic device as claimed in claim 1, wherein the crystalline binder material is a semi-crystalline polymer.

6. The electronic device as claimed in claim 1, wherein the organic semiconducting material has a melting point above that of the crystalline binder material.

7. The electronic device as claimed in claim 1, wherein the crystalline binder material exhibits a spherrulitic microstructure.

8. The electronic device as claimed in claim 1, wherein the concentration of the organic semiconducting material in the semiconducting body is less than 50% by weight.

9. The electronic device as claimed in claim 1, wherein the concentration of the organic semiconducting material in the semiconducting body is less than 20% by weight.

10. The electronic device as claimed in claim 1, wherein the concentration of the organic semiconducting material in the semiconducting body is less than 10% by weight.

11. The electronic device as claimed in claim 1, wherein the semiconducting body forms a plastic substrate.

12. An electronic device comprising a semiconducting body, the body comprising:
    an organic semiconducting material; and
    a crystalline binder material,
    wherein the semiconducting material is at least partially segregated from the binder material and concentrated at an outer portion of the semiconducting body, and the binder material is concentrated at an inner portion of the semiconducting body, and
    wherein the device is selected from the group consisting of a transistor, a diode and a photovoltaic diode, and
    wherein the semiconducting body is a film having an upper surface and a lower surface, and said outer portion comprises both a portion at said upper surface and a portion at said lower surface.

13. The electronic device as claimed in claim 12, wherein the organic semiconducting material is also concentrated at one or more portions adjacent to one or more voids inside the film.

14. The electronic device according to claim 1, wherein the organic semiconducting material is partly miscible in the binder material, and the concentration of organic semiconducting material is higher than a concentration that is wholly miscible in the binder material.

15. The electronic device according to claim 1, wherein said source and drain electrodes are adjacent to said outer portion of the semiconducting body.

16. An electronic device comprising a semiconducting body, the body comprising:
    an organic semiconducting material; and
    a crystalline binder material; wherein the semiconducting material is at least partially segregated from the binder material and concentrated at an outer portion of the semiconducting body, and the binder material is concentrated at an inner portion of the semiconducting body,
    wherein the concentration of the organic semiconducting material in the semiconducting body is less than 50% by weight.

* * * * *